(12) United States Patent
Qiao et al.

(10) Patent No.: US 11,705,990 B2
(45) Date of Patent: Jul. 18, 2023

(54) CHANNEL ENCODING METHOD AND APPARATUS

(71) Applicant: HUAWEI TECHNOLOGIES CO., LTD., Shenzhen (CN)

(72) Inventors: Yunfei Qiao, Hangzhou (CN); Juan Song, Shenzhen (CN); Yinggang Du, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/954,425

(22) Filed: Sep. 28, 2022

(65) Prior Publication Data
US 2023/0022075 A1    Jan. 26, 2023

Related U.S. Application Data

(63) Continuation of application No. 17/209,674, filed on Mar. 23, 2021, now Pat. No. 11,496,245, which is a
(Continued)

(30) Foreign Application Priority Data

Sep. 28, 2018  (CN) .......................... 201811140849.3

(51) Int. Cl.
H04L 1/00      (2006.01)

(52) U.S. Cl.
CPC .......... *H04L 1/0071* (2013.01); *H04L 1/0041* (2013.01); *H04L 1/0057* (2013.01)

(58) Field of Classification Search
CPC ... H04L 1/0041; H04L 1/0045; H04L 1/0057; H04L 1/0071
See application file for complete search history.

(56) References Cited

U.S. PATENT DOCUMENTS

2010/0111219 A1*  5/2010  Wang ................. H04L 27/2601
                                                    375/295
2012/0033321 A1   2/2012  Cideciyan et al.
(Continued)

FOREIGN PATENT DOCUMENTS

| CN | 102724021 A | 10/2012 |
| CN | 104219019 A | 12/2014 |

(Continued)

OTHER PUBLICATIONS

Huawei et al., "Distributed CRC for Polar code construction", 3GPP TSG RAN WG1 Meeting #90, Prague, Czech Republic, Aug. 21-25, 2017, R1-1712167, 7 pages.
(Continued)

*Primary Examiner* — Shelly A Chase
(74) *Attorney, Agent, or Firm* — Maier & Maier, PLLC

(57) ABSTRACT

A channel encoding method and apparatus. The method includes: obtaining A to-be-encoded information bits; mapping the A to-be-encoded information bits and L CRC bits to a first bit sequence based on an interleaving sequence, where the L CRC bits are obtained based on the A to-be-encoded information bits and a CRC polynomial, the interleaving sequence is obtained from a prestored interleaving sequence table or is obtained based on a maximum-length interleaving sequence, A+L is less than or equal to Kmax, and Kmax is a length of the maximum-length interleaving sequence; and encoding the first bit sequence. In this way, not only an encoding delay can be reduced, but also decoding has an early stop capability, so that decoding can end in advance, thereby reducing a decoding delay.

13 Claims, 4 Drawing Sheets

Related U.S. Application Data continuation of application No. PCT/CN2019/104937, filed on Sep. 9, 2019.

(56) References Cited

U.S. PATENT DOCUMENTS

| | | | |
|---|---|---|---|
| 2014/0304574 A1 | 10/2014 | Seo et al. | |
| 2018/0076926 A1* | 3/2018 | Zhang | H04N 21/438 |
| 2020/0244288 A1 | 7/2020 | Noh et al. | |
| 2021/0152186 A1 | 5/2021 | Jang et al. | |

FOREIGN PATENT DOCUMENTS

| | | |
|---|---|---|
| CN | 108540141 A | 9/2018 |
| CN | 108781124 A | 11/2018 |
| CN | 109889310 A | 6/2019 |
| EP | 3471303 A1 | 4/2019 |

OTHER PUBLICATIONS

Ericsson, "Arrangement of PBCH Fields for Polar Codes", 3GPP TSG RAN WG1 Meeting 91, Reno, USA, Nov. 27-Dec. 1, 2017, R1-1719608, 15 pages.

Qualcomm Incorporated, "Design and evaluation of interleaver for Polar codes", 3GPP TSG-RAN RAN1#90. Aug. 21-25, 2017, Prague, CZ, R1-1715248, 13 pages.

* cited by examiner

CHANNEL ENCODING METHOD AND APPARATUS

CROSS-REFERENCE TO RELATED APPLICATIONS

This application is a continuation of U.S. patent application Ser. No. 17/209,674, filed on Mar. 23, 2021, which is a continuation of International Patent Application PCT/CN2019/104937, filed on Sep. 9, 2019, which claims priority to Chinese Patent Application No. 201811140849.3, filed on Sep. 28, 2018. All of the afore-mentioned patent applications are hereby incorporated by reference in their entireties.

TECHNICAL FIELD

The embodiments relate to the field of communications technologies, a channel encoding method, and an apparatus.

BACKGROUND

In a communications system, channel encoding is usually used to improve data transmission reliability and ensure communication quality. A polar code is the first channel encoding method that can be theoretically proved to "achieve" a channel capacity. The polar code is a linear block code, a generator matrix of the polar code is $G_N$, and an encoding process of the polar code is $x_1^N = u_1^N G_N \cdot u_1^N = (u_1, u_2, \ldots, u_N)$ is a binary row vector whose length is N (that is, a code length). $G_N = B_N F_2^{\otimes (log_2(N))}$. Herein, $$F_2 = \begin{bmatrix} 1 & 0 \\ 1 & 1 \end{bmatrix},$$

and $B_N$ is an N×N transpose matrix, for example, a bit reversal transpose matrix. Alternatively, $B_N$ may not be used during actual implementation. $F_2^{\otimes (log_2(N))}$ is defined as a Kronecker product of $log_2 N$ matrices $F_2 \cdot x_1^N$ is an encoded bit (also referred to as a codeword), and the encoded bit is obtained by multiplying $u_1^N$ by the generator matrix $G_N$. A multiplication process is the encoding process. In a polar code encoding process, some bits in $u_1^N$ are used to carry information and are referred to as information bits, and a set of indexes of the information bits is denoted as A. Other bits in $u_1^N$ are set to fixed values pre-agreed on by a transmit end and a receive end and are referred to as frozen bits, and a set of indexes of the frozen bits is represented by a complementary set $A^c$ of A.

In a decoder, the polar code may be sequentially decoded from the first bit by using a successive cancellation list (SCL) decoding algorithm. A plurality of candidate decoding results are retained in a decoding process, and the first bit is used as a root node to extend a path. A metric value is used to evaluate the path, and the metric value is dynamically updated according to a preset rule as the path extends. Each time extension is performed (a next bit is decoded), Lx candidate paths with optimal path metrics at a current layer are retained until extension to the last layer is performed (the last bit is decoded). Finally, a path with an optimal metric in the Lx candidate paths is output as a decoding output.

To improve performance of a polar code, an outer code having a check capability may be cascaded outside the polar code. A CA-polar code is a polar code of a cascaded cyclic redundancy check (CRC) code. An encoding process of the CA-polar code is: performing CRC encoding on an information bit of to-be-encoded information to obtain a CRC-encoded bit sequence, where the CRC-encoded bit sequence includes an information bit and a CRC bit; and then performing polar encoding on the CRC-encoded bit sequence. The CA-polar code is decoded by using a CRC-Aided Successive Cancellation List (CA-SCL) decoding algorithm. After SCL decoding ends, a CRC check is performed on Lx candidate paths output by the SCL decoding, and a candidate path on which the CRC check succeeds is used as a decoding output result. If no candidate path passes the CRC check, it is determined that decoding fails. Therefore, for the CA-polar code, the CRC check can be performed only after channel decoding ends, and a time occupied for a failed decoding process is the same as a time occupied for a successful decoding process. In a downlink blind detection scenario of a control channel of a wireless communications system, decoding usually needs to be attempted for dozens of times, and decoding can succeed only once. If a decoding attempt that fails can stop in advance (early stop), a decoding delay of entire blind detection and average energy consumption can be effectively reduced. Distributed CRC encoding is put forward as a CRC encoding manner with an "early stop" capability. During the distributed CRC encoding, an interleaving operation is introduced after conventional CRC encoding ends. To be specific, CRC bits obtained after CRC encoding are distributed among information bits. In an SCL decoding process of a decoder, at a moment before decoding ends, when all candidate paths cannot satisfy checks on some CRC bits on which decoding has been completed, decoding may end in advance.

SUMMARY

The embodiments provide a channel encoding method and apparatus. A distributed cascaded cyclic redundancy check (CRC) mechanism is used, so that decoding has an early stop capability, and a decoding delay is reduced.

According to a first aspect, the embodiments provide a channel encoding method. The method includes: obtaining A to-be-encoded information bits; mapping the A to-be-encoded information bits and L CRC bits to a first bit sequence based on an interleaving sequence, where the L CRC bits are obtained based on the A to-be-encoded information bits and a CRC polynomial, the interleaving sequence is obtained from a prestored interleaving sequence table or is obtained based on a maximum-length interleaving sequence, A+L is less than or equal to Kmax, and Kmax is a length of the maximum-length interleaving sequence; and encoding the first bit sequence.

According to the channel encoding method provided in the first aspect, after the A to-be-encoded information bits are obtained, the A to-be-encoded information bits and the L CRC bits are mapped to the first bit sequence based on the interleaving sequence. The L CRC bits are obtained based on the A to-be-encoded information bits and the CRC polynomial, and the interleaving sequence is obtained from the prestored interleaving sequence table or is obtained based on the maximum-length interleaving sequence. Finally, the first bit sequence is encoded. In this way, not only an encoding delay can be reduced, but also decoding has an early stop capability, so that decoding can end in advance, thereby reducing a decoding delay.

In a possible implementation, before the mapping of the A to-be-encoded information bits and L CRC bits to a first bit sequence based on an interleaving sequence, the method further includes: performing CRC encoding on the A to-be-encoded information bits based on the CRC polynomial to obtain the L CRC bits.

According to the channel encoding method provided in this implementation, after the A to-be-encoded information bits are obtained, the corresponding interleaving sequence is obtained from the interleaving sequence table based on the quantity A of the information bits. Subsequently, CRC encoding is performed. Then, an interleaving operation is performed, based on the interleaving sequence, on a bit sequence including the A to-be-encoded information bits and the L CRC bits, to map the bit sequence to the first bit sequence. Finally, the first bit sequence is encoded. Interleaving sequences corresponding to different quantities of information bits are directly stored, so that an encoding delay can be effectively reduced. Moreover, decoding has an early stop capability, so that decoding can end in advance, thereby reducing a decoding delay.

In a possible implementation, the mapping the A to-be-encoded information bits and L CRC bits to a first bit sequence based on an interleaving sequence includes: mapping the A to-be-encoded information bits and the L CRC bits to the first bit sequence based on the interleaving sequence according to the following rule:

if a to-be-mapped bit is an information bit, mapping the to-be-mapped bit to a corresponding location based on an index of the to-be-mapped bit in the interleaving sequence; or if a to-be-mapped bit is a CRC bit, determining a value of the to-be-mapped bit based on A and the CRC polynomial, and mapping the to-be-mapped bit to a corresponding location.

According to the channel encoding method provided in this implementation, after the A to-be-encoded information bits are obtained, the interleaving sequence is obtained based on the quantity A of the information bits. Then, CRC encoding and the interleaving operation are simultaneously performed to obtain the first bit sequence. Finally, the first bit sequence is encoded. In this way, a distributed CRC encoding process can be quickly completed to perform channel encoding as soon as possible, so as to reduce an encoding delay. Moreover, decoding has an early stop capability, so that decoding can end in advance, thereby reducing a decoding delay.

In a possible implementation, the determining of a value of the to-be-mapped bit based on A and the CRC polynomial, and mapping the to-be-mapped bit to a corresponding location includes: determining, based on A and the CRC polynomial, all information bits checked by using the to-be-mapped bit; and performing addition modulo 2 on all the information bits checked by using the to-be-mapped bit to obtain the value of the to-be-mapped bit and mapping the to-be-mapped bit to the corresponding location.

In a possible implementation, the determining of a value of the to-be-mapped bit based on A and the CRC polynomial, and mapping the to-be-mapped bit to a corresponding location includes: finding a correspondence that is between at least one CRC bit and at least one information bit and that corresponds to A from a prestored table of correspondences between CRC bits and information bits, where the correspondence between at least one CRC bit and at least one information bit indicates all information bits checked by using each of the L CRC bits, and the correspondence between at least one CRC bit and at least one information bit is obtained based on an information bit length and the CRC polynomial;

determining, based on the correspondence that is between at least one CRC bit and at least one information bit and that corresponds to A, all information bits checked by using the to-be-mapped bit; and performing addition modulo 2 on all the information bits checked by using the to-be-mapped bit to obtain the value of the to-be-mapped bit and mapping the to-be-mapped bit to the corresponding location.

In a possible implementation, in the interleaving sequence table, each information bit length corresponds to one interleaving sequence.

According to a second aspect, the embodiments provide a channel encoding apparatus using a distributed CRC mechanism. The apparatus includes: an obtaining module, configured to obtain A to-be-encoded information bits; a processing module, configured to map the A to-be-encoded information bits and L CRC bits to a first bit sequence based on an interleaving sequence, where the L CRC bits are obtained based on the A to-be-encoded information bits and a CRC polynomial, the interleaving sequence is obtained from a prestored interleaving sequence table or is obtained based on a maximum-length interleaving sequence, A+L is less than or equal to Kmax, and Kmax is a length of the maximum-length interleaving sequence; and an encoding module, configured to encode the first bit sequence.

In a possible implementation, the apparatus further includes: a CRC encoding module, configured to: before the processing module maps the A to-be-encoded information bits and the L CRC bits to the first bit sequence based on the interleaving sequence, perform CRC encoding on the A to-be-encoded information bits based on the CRC polynomial to obtain the L CRC bits.

In a possible implementation, the processing module is configured to:

map the A to-be-encoded information bits and the L CRC bits to the first bit sequence based on the interleaving sequence and according to the following rule:

if a to-be-mapped bit is an information bit, mapping the to-be-mapped bit to a corresponding location based on an index of the to-be-mapped bit in the interleaving sequence; or if a to-be-mapped bit is a CRC bit, determining a value of the to-be-mapped bit based on A and the CRC polynomial, and mapping the to-be-mapped bit to a corresponding location.

In a possible implementation, the processing module is configured to:

determine, based on A and the CRC polynomial, all information bits checked by using the to-be-mapped bit; and perform addition modulo 2 on all the information bits checked by using the to-be-mapped bit to obtain the value of the to-be-mapped bit and map the to-be-mapped bit to the corresponding location.

In a possible implementation, the processing module is configured to:

identify a correspondence that is between at least one CRC bit and at least one information bit and that corresponds to A from a prestored table of correspondences between CRC bits and information bits, where the correspondence between at least one CRC bit and at least one information bit indicates all information bits checked by using each of the L CRC bits, and the correspondence between at least one CRC bit and at least one information bit is obtained based on an information bit length and the CRC polynomial;

determine, based on the correspondence that is between at least one CRC bit and at least one information bit and that corresponds to A, all information bits checked by using the to-be-mapped bit; and perform addition modulo 2 on all the information bits checked by using the to-be-mapped bit to obtain the value of the to-be-mapped bit and map the to-be-mapped bit to the corresponding location.

In a possible implementation, in the interleaving sequence table, each information bit length corresponds to one interleaving sequence.

For beneficial effects of the encoding apparatus provided in the second aspect and the possible implementations of the second aspect, refer to the beneficial effects brought by the first aspect and the possible implementations of the first aspect. Details are not described herein again.

According to a third aspect, the embodiments provide a channel encoding apparatus using a distributed CRC mechanism. The apparatus includes a memory and a processor.

The memory is configured to store a program instruction.

The processor is configured to invoke the program instruction in the memory, to perform the channel encoding method according to the first aspect and any possible implementation of the first aspect.

According to a fourth aspect, the embodiments provide a non-transitory computer-readable storage medium. The non-transitory computer-readable storage medium includes a computer program. The computer program is used to implement the channel encoding method according to the first aspect and any possible implementation of the first aspect.

According to a fifth aspect, the embodiments provide a program product. The program product includes a computer program, and the computer program is stored in a non-transitory computer-readable storage medium. At least one processor of a channel encoding apparatus may read the computer program from the non-transitory computer-readable storage medium, and the at least one processor executes the computer program, so that the channel encoding apparatus implements the channel encoding method according to the first aspect and any possible implementation of the first aspect.

According to a sixth aspect, the embodiments provide a chip. The chip is connected to a memory, or a memory is integrated into the chip. When a software program stored in the memory is executed, the channel encoding method according to the first aspect and any possible implementation of the first aspect is implemented.

DETAILED DESCRIPTION OF THE EMBODIMENTS

The embodiments may be applied to a wireless communications system. It should be noted that the wireless communications system in the embodiments includes, but is not limited to: a narrowband internet of things (NB-IoT) system, a global system for mobile communications (GSM), an enhanced data rates for GSM evolution (EDGE) system, a wideband code division multiple access (WCDMA) system, a code division multiple access 2000 (CDMA2000) system, a time division-synchronization code division multiple access (TD-SCDMA) system, a long term evolution (LTE) system, and three major application scenarios of a fifth generation (5G) mobile communications system, namely, enhanced mobile broadband (eMBB), ultra reliable & low latency communication (URLLC), and massive machine-type communications (mMTC).

A communications apparatus in the embodiments may be either a network device or a terminal device. In the embodiments, if a transmit end is the network device, a receive end is the terminal device. In embodiments, if a transmit end is the terminal device, a receive end is the network device.

In the embodiments, the terminal device includes, but is not limited to, a mobile station (MS), a mobile terminal, a mobile telephone, a handset, portable equipment, and the like. The terminal device may communicate with one or more core networks through a radio access network (RAN). For example, the terminal device may be a mobile telephone (or referred to as a "cellular" telephone), or a computer having a communication function; or the terminal device may be a portable, pocket-sized, handheld, computer built-in, or vehicle-mounted mobile apparatus or device.

In the embodiments, the network device may be a device configured to communicate with the terminal device. For example, the network device may be a base transceiver station (BTS) in a GSM system or a CDMA system, a NodeB (NB) in a WCDMA system, or an evolved NodeB (eNB) in an LTE system; or the network device may be a relay station, an access point, a vehicle-mounted device, a wearable device, a network side device in a future 5G network, or a network device in a future evolved public land mobile network (PLMN). Alternatively, the network device may be a terminal device responsible for a network device function during D2D communication.

Figure 1:
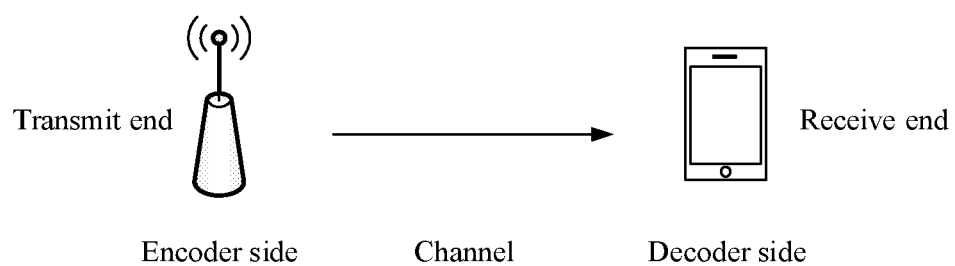
FIG. 1 is a schematic diagram of a system architecture including a transmit end and a receive end according to the embodiments.

A communications system may include a transmit end and a receive end. FIG. 1 is a schematic diagram of a system architecture including a transmit end and a receive end according to the embodiments. As shown in FIG. 1, the transmit end is an encoder side, and may be configured to perform encoding and output encoded information. The encoded information is transmitted to a decoder side on a channel. The receive end is the decoder side and may be configured to: receive the encoded information sent by the transmit end and decode the encoded information.

Figure 2:
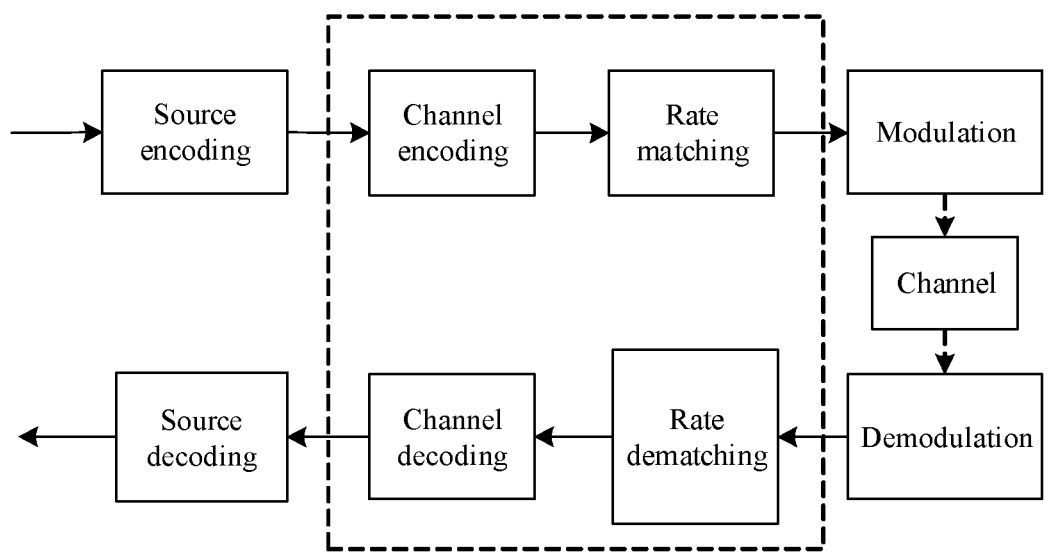
FIG. 2 is a schematic flowchart of a communications system.

FIG. 2 is a schematic flowchart of a communications system. As shown in FIG. 2, at a transmit end, a signal source symbol is sent after source encoding, channel encoding, interleaving, rate matching, and digital modulation are sequentially performed on the signal source symbol. At a receive end, a signal sink symbol is output after digital demodulation, de-interleaving, rate de-matching, channel decoding, and source decoding are sequentially performed on the signal sink symbol. A polar code or a CA-polar code may be used for channel encoding and decoding, and a channel encoding method in which a distributed cascaded cyclic redundancy check (CRC) mechanism is applied provided in the embodiments may be used for the channel encoding.

According to the channel encoding method and apparatus provided in the embodiments, not only an encoding delay can be reduced, but also decoding has an early stop capability, so that decoding can end in advance, thereby reducing a decoding delay. The channel encoding method and apparatus provided in the embodiments are described in detail below with reference to the accompanying drawings.

It should be noted that, to complete an interleaving function, there are two numbering manners for an interleaving sequence: numbering information bits in natural order, and numbering information bits in reverse order (briefly referred to as natural-order numbering and reverse-order numbering below). The natural-order numbering means that a ranking of an index of a corresponding information bit in an interleaving sequence is the same as a ranking of the index of the information bit; for example, an index 0 corresponds to a $0^{th}$ information bit, an index 1 corresponds to a $1^{st}$ information bit, and so on. The reverse-order numbering means that a ranking of an index of a corresponding information bit in an interleaving sequence is reverse to a ranking of an index of the information bit; for example, an index 0 corresponds to a last information bit, an index 1 corresponds to a last but one information bit, and so on.

In addition, a minimum index based on the interleaving sequence in the embodiments is 0. If a minimum index of an actually used interleaving sequence is 1, the method in this embodiment may be simply adjusted. In all examples in the embodiments, indexes start from 0. During actual application, if indexes start from 1, each corresponding index is increased by 1.

Figure 3:
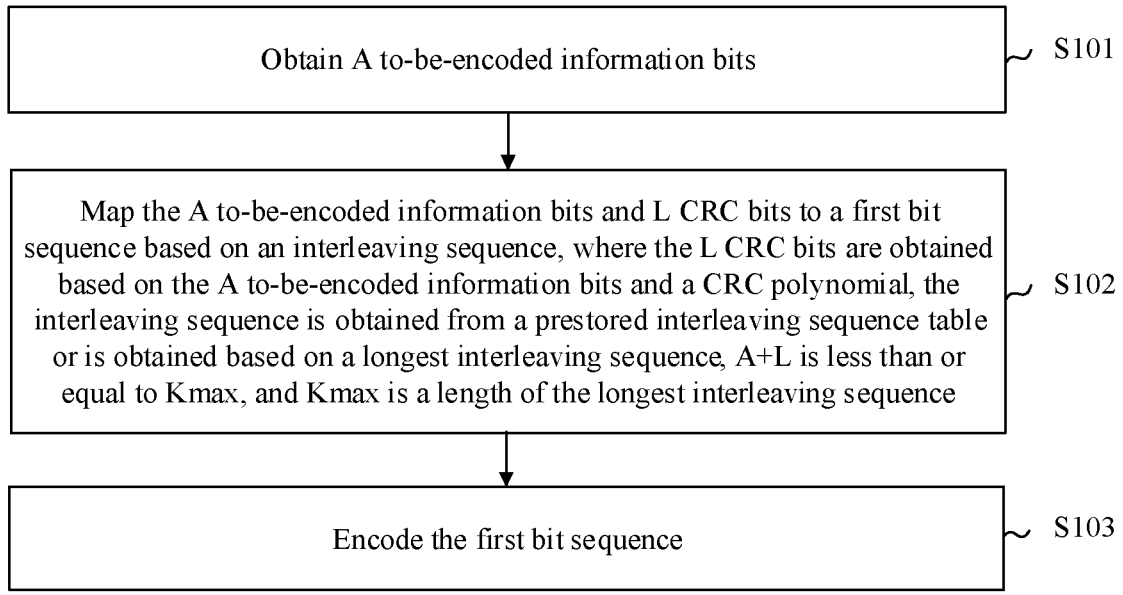
FIG. 3 is a flowchart of an embodiment of a channel encoding method.

FIG. 3 is a flowchart of an embodiment of a channel encoding method according to the embodiments. As shown in FIG. 3, this embodiment is performed by a transmit end (an encoder). The method in this embodiment may include the following steps.

S101. Obtain A to-be-encoded information bits.

S102. Map the A to-be-encoded information bits and L CRC bits to a first bit sequence based on an interleaving sequence, where the L CRC bits are obtained based on the A to-be-encoded information bits and a CRC polynomial, the interleaving sequence is obtained from a prestored interleaving sequence table or is obtained based on a maximum-length interleaving sequence, A+L is less than or equal to Kmax, and Kmax is a length of the maximum-length interleaving sequence.

For example, in an implementable manner, the interleaving sequence in this embodiment may be obtained from the prestored interleaving sequence table. A system prestores the interleaving sequence table. In the interleaving sequence table, each information bit length corresponds to one interleaving sequence. For example, when A=64, a corresponding interleaving sequence is π1, and π1 is, for example, 0, 1, 5, 6, 7, 11, 12, 13, 15, 17, 19, 22, 25, 28, 30, 32, 34, 35, 37, 39, 42, 43, 44, 46, 47, 50, 51, 53, 56, 58, 62, 63, 64, 2, 8, 14, 16, 18, 20, 23, 26, 29, 31, 33, 36, 38, 40, 45, 48, 52, 54, 57, 59, 65, 3, 9, 21, 24, 27, 41, 49, 55, 60, 66, 4, 10, 61, 67, 68, 69, 70, 71, 72, 73, 74, 75, 76, 77, 78, 79, 80, 81, 82, 83, 84, 85, 86, 87.

When A=63, a corresponding interleaving sequence is π2, and π2 is, for example, 0, 4, 5, 6, 10, 11, 12, 14, 16, 18, 21, 24, 27, 29, 31, 33, 34, 36, 38, 41, 42, 43, 45, 46, 49, 50, 52, 55, 57, 61, 62, 63, 1, 7, 13, 15, 17, 19, 22, 25, 28, 30, 32, 35, 37, 39, 44, 47, 51, 53, 56, 58, 64, 2, 8, 20, 23, 26, 40, 48, 54, 59, 65, 3, 9, 60, 66, 67, 68, 69, 70, 71, 72, 73, 74, 75, 76, 77, 78, 79, 80, 81, 82, 83, 84, 85, 86.

After the A to-be-encoded information bits are obtained, the corresponding interleaving sequence may be identified from the interleaving sequence table based on a quantity (length) of information bits. An encoding delay can be reduced by prestoring an interleaving sequence.

In another implementable manner, the interleaving sequence in this embodiment may be obtained based on the maximum-length interleaving sequence. A system prestores a maximum-length interleaving sequence corresponding to a maximum information bit length. After the A to-be-encoded information bits are obtained, the interleaving sequence may be obtained based on a quantity (length) of information bits, the maximum-length interleaving sequence, and a preset rule. For example, all indexes greater than or equal to $K_{max}$–A are selected from the maximum-length interleaving sequence in an order of indexes, and each of all the selected indexes is subtracted by $K_{max}$–A to form the interleaving sequence. For example, the maximum-length interleaving sequence is {2, 3, 5, 9, 10, 12, 4, 6, 11, 13, 0, 7, 14, 1, 8, 15}, a maximum quantity of information bits corresponding to the maximum-length interleaving sequence satisfies that $K_{max}$=12, L=4, A=10, and $K_{ma}$–A=2. First, all indexes greater than or equal to 2 are selected from the maximum-length interleaving sequence in an order of indexes, which are {2, 3, 5, 9, 10, 12, 4, 6, 11, 13, 7, 14, 8, 15}. Each of all the selected indexes is subtracted by 2 to form an interleaving sequence {0, 1, 3, 7, 8, 10, 2, 4, 9, 11, 5, 12, 6, 13}. Therefore, during encoding, when the quantity of information bits is less than the maximum quantity of information bits, an interleaving sequence required for completing an interleaving process is obtained based on the maximum-length interleaving sequence. The system stores only one maximum-length interleaving sequence, so that occupied memory can be reduced.

In this embodiment, after the interleaving sequence is obtained, there are two implementable manners for mapping the A to-be-encoded information bits and the L CRC bits to the first bit sequence based on the interleaving sequence:

Manner 1: First, CRC encoding is performed on the A to-be-encoded information bits based on the CRC polynomial to obtain the L CRC bits. For example, the CRC polynomial is $g_{CRC24C}(D)=[D^{24}+D^{23}+D^{21}+D^{20}+D^{17}+D^{15}+D^{13}+D^{12}+D^{8}+D^{4}+D+1]$, a length is L, and the CRC polynomial is prestored by the system. A bit sequence including the A to-be-encoded information bits is $a_0, a_1, \ldots, a_{A-1}$. After CRC encoding is performed, the L CRC bits are added to obtain a sequence $b_0, b_1, \ldots, b_{A+L-1}$, where $b_k=a_k$, k=0, 1, \ldots, A-1, $b_k=p_{k-A}$, k=A, A+1, \ldots, A+L-1, p is a CRC bit sequence with a length of L. Subsequently, the A to-be-encoded information bits and the L CRC bits are mapped to the first bit sequence based on the interleaving sequence. For example, the bit sequence $b_0, b_1, \ldots, b_{A+L-1}$ including the A to-be-encoded information bits and the L CRC bits are mapped based on an obtained interleaving sequence π1, to obtain a sequence $c_0, c_1, \ldots, c_{A+L-1}$, where $c_k=b_{\pi 1_k}$.

In manner 1, CRC encoding is performed first, and then, an interleaving operation is performed, based on the interleaving sequence, on the bit sequence including the A to-be-encoded information bits and the L CRC bits, to map the bit sequence to the first bit sequence.

Manner 2: The A to-be-encoded information bits and the L CRC bits are mapped to the first bit sequence based on the interleaving sequence and according to the following rule:

if a to-be-mapped bit is an information bit, mapping the to-be-mapped bit to a corresponding location based on an index of the to-be-mapped bit in the interleaving sequence, in other words, directly mapping the information bit to a corresponding location based on an index of the information bit in the interleaving sequence; or if a to-be-mapped bit is a CRC bit, determining a value of the to-be-mapped bit based on A and the CRC polynomial, and mapping the to-be-mapped bit to a corresponding location.

In this embodiment, there are two implementable manners for determining the value of the to-be-mapped bit based on A and the CRC polynomial and mapping the to-be-mapped bit to the corresponding location. All information bits checked by using the to-be-mapped bit are determined based on A and the CRC polynomial; and addition modulo 2 is performed on all the information bits checked by using the to-be-mapped bit to obtain the value of the to-be-mapped bit, and the to-be-mapped bit is mapped to the corresponding location. In this manner, the CRC polynomial is prestored, and all the information bits checked by using the to-be-mapped bit are determined based on A in an online calculation manner.

Alternatively, a correspondence that is between at least one CRC bit and at least one information bit and that corresponds to A is identified from a prestored table of correspondences between CRC bits and information bits, where the correspondence between at least one CRC bit and at least one information bit indicates all information bits checked by using each of the L CRC bits, and the correspondence between at least one CRC bit and at least one information bit is obtained based on an information bit length and the CRC polynomial. In this manner, the correspondence between at least one CRC bit and at least one information bit is calculated in advance based on the information bit length and the CRC polynomial in an offline storage manner. Then, a correspondence that is between at least one CRC bit and at least one information bit and that corresponds to each information bit length is stored. For example, the information stored in the system may be (information bit length $A_1$: correspondence 1 between at least one CRC bit and at least one information bit), (information bit length $A_2$: correspondence 2 between at least one CRC bit and at least one information bit), (information bit length $A_3$: correspondence 3 between at least one CRC bit and at least one information bit), . . . , and (information bit length $A_n$: correspondence n between at least one CRC bit and at least one information bit). In the offline storage manner, online calculation can be avoided, thereby reducing an encoding time. Subsequently, all the information bits checked by using the to-be-mapped bit are determined based on the correspondence that is between at least one CRC bit and at least one information bit and that corresponds to A, addition modulo 2 is performed on all the information bits checked by using the to-be-mapped bit to obtain the value of the to-be-mapped bit, and the to-be-mapped bit is mapped to the corresponding location.

In manner 2, CRC encoding and the interleaving operation that is performed based on the interleaving sequence are simultaneously performed.

It should be noted that, regardless of which manner is used, in the interleaving sequence, each CRC bit is definitely located after all information bits checked by using the CRC bit.

S103. Encode the first bit sequence.

Here, the encoding performed on the first bit sequence may be polar encoding, LDPC encoding, or another manner of channel encoding.

According to the channel encoding method provided in this embodiment, after the A to-be-encoded information bits are obtained, the A to-be-encoded information bits and the L CRC bits are mapped to the first bit sequence based on the interleaving sequence. The L CRC bits are obtained based on the A to-be-encoded information bits and the CRC polynomial, and the interleaving sequence is obtained from the prestored interleaving sequence table or is obtained based on the maximum-length interleaving sequence. Finally, the first bit sequence is encoded. In this way, not only an encoding delay can be reduced, but also decoding has an early stop capability, so that decoding can end in advance, thereby reducing a decoding delay.

The following uses two embodiments to describe in detail the solution of the method embodiment shown in FIG. 3.

Figure 4:
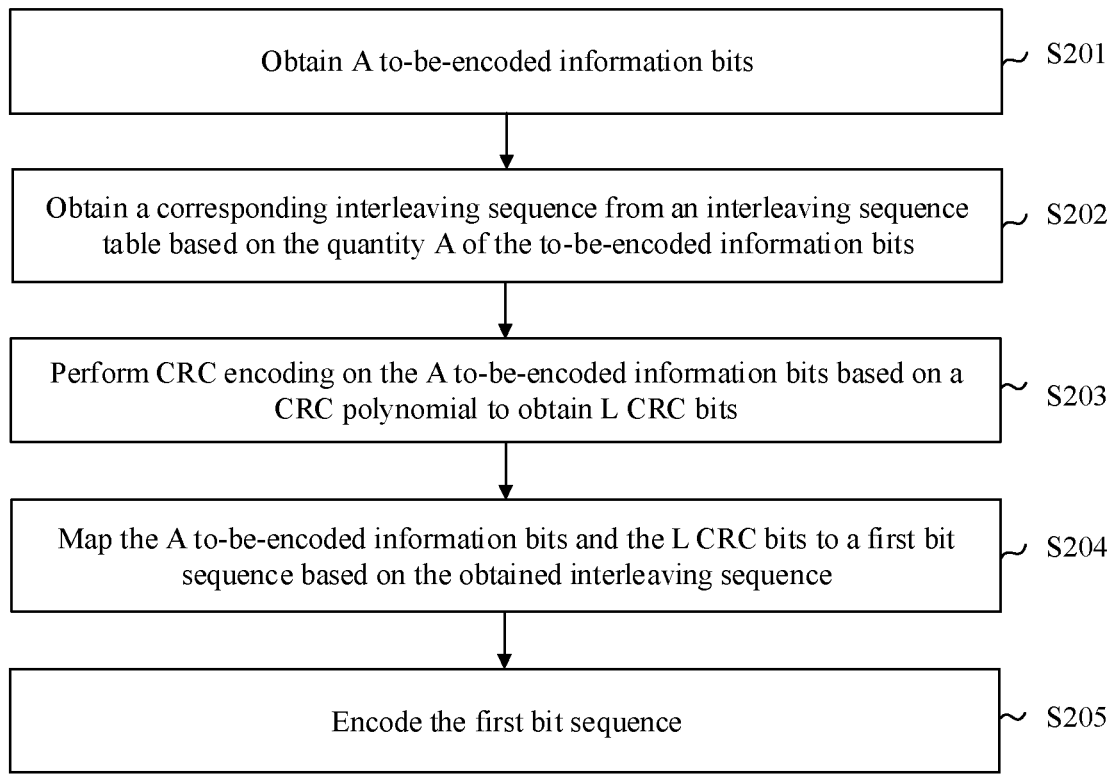
FIG. 4 is a flowchart of an embodiment of a channel encoding method.

FIG. 4 is a flowchart of an embodiment of a channel encoding method according to the embodiments. As shown in FIG. 4, this embodiment is performed by a transmit end (an encoder). The method in this embodiment may include the following steps.

S201. Obtain A to-be-encoded information bits.

S202. Obtain a corresponding interleaving sequence from an interleaving sequence table based on the quantity A of the to-be-encoded information bits.

Thus, a system prestores the interleaving sequence table. In the interleaving sequence table, each information bit length corresponds to one interleaving sequence. After the A to-be-encoded information bits are obtained, the corresponding interleaving sequence may be identified from the interleaving sequence table based on the quantity A of the information bits.

S203. Perform CRC encoding on the A to-be-encoded information bits based on a CRC polynomial to obtain L CRC bits.

For example, the CRC polynomial is $g_{CRC24C}(D)[D^{24}+D^{23}+D^{21}+D^{20}+D^{17}+D^{15}+D^{13}+D^{12}+D^8+D^4+D^2+D+1]$, a length is L, and the CRC polynomial is prestored by the system. A bit sequence including the A to-be-encoded information bits is $a_0, a_1, \ldots, a_{A-1}$. After CRC encoding is performed, the L CRC bits are added to obtain a sequence $b_0, b_1, \ldots, b_{A+L-1}$, where $b_k = a_k$, $k=0, 1, \ldots, A-1$, $b_k = p_{k-A}$, $k=A, A+1, \ldots, A+L-1$, p is a CRC bit sequence, and a length is L.

S204. Map the A to-be-encoded information bits and the L CRC bits to a first bit sequence based on the obtained interleaving sequence.

For example, the interleaving sequence obtained in S202 is $\pi 1$, and the bit sequence $b_0, b_1, \ldots, b_{A+L-1}$ including the A to-be-encoded information bits and the L CRC bits is mapped based on the interleaving sequence $\pi 1$ to obtain a sequence $c_0, c_1, \ldots,$ where $c_k = b_{\pi 1_k}$.

S205. Encode the first bit sequence.

According to the channel encoding method provided in this embodiment, after the A to-be-encoded information bits are obtained, the corresponding interleaving sequence is obtained from the interleaving sequence table based on the quantity A of the information bits. Subsequently, CRC encoding is performed. Then, an interleaving operation is performed, based on the interleaving sequence, on the bit sequence including the A to-be-encoded information bits and the L CRC bits, to map the bit sequence to the first bit sequence. Finally, the first bit sequence is encoded. Interleaving sequences corresponding to different quantities of information bits are directly stored, so that an encoding delay can be effectively reduced. Moreover, decoding has an early stop capability, so that decoding can end in advance, thereby reducing a decoding delay.

Figure 5:
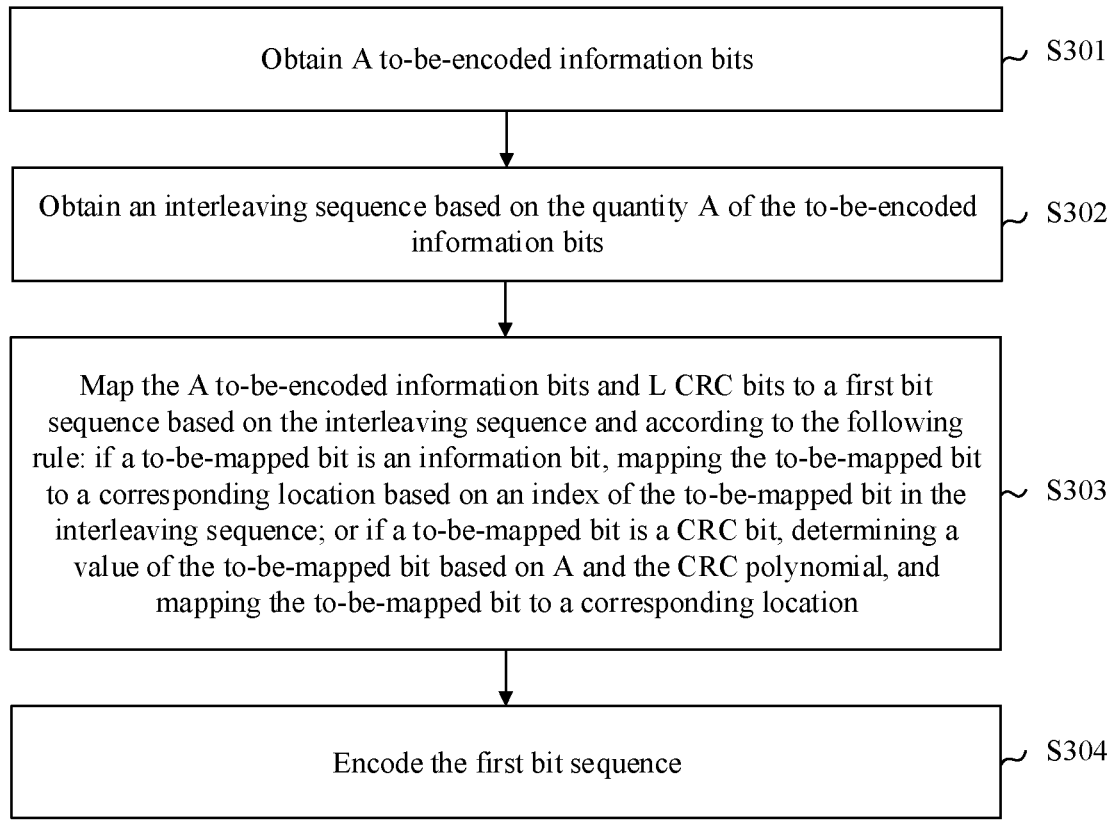
FIG. 5 is a flowchart of an embodiment of a channel encoding method.

FIG. 5 is a flowchart of an embodiment of a channel encoding method according to the embodiments. As shown in FIG. 5, this embodiment is performed by a transmit end (an encoder). The method in this embodiment may include the following steps.

S301. Obtain A to-be-encoded information bits.

S302. Obtain an interleaving sequence based on the quantity A of the to-be-encoded information bits.

Thus, the corresponding interleaving sequence may be obtained from a prestored interleaving sequence table based on the quantity A of the information bits. In the interleaving sequence table, each information bit length corresponds to one interleaving sequence. After the A to-be-encoded information bits are obtained, the corresponding interleaving sequence may be identified from the interleaving sequence table based on the quantity A of the information bits.

Alternatively, the interleaving sequence may be obtained based on the quantity A of the information bits, a maximum-length interleaving sequence, and a preset rule. A system prestores the maximum-length interleaving sequence corresponding to a maximum information bit length. When a quantity of information bits is less than a maximum quantity of information bits, an interleaving sequence required to complete an interleaving process is obtained based on the maximum-length interleaving sequence and the preset rule. For example, the preset rule is: All indexes greater than or equal to $K_{max}$-A are selected from the maximum-length interleaving sequence in an order of the indexes, and each of all the selected indexes is subtracted by $K_{max}$-A to form the interleaving sequence.

S303. Map the A to-be-encoded information bits and L CRC bits to a first bit sequence based on the interleaving sequence and according to the following rule:

if a to-be-mapped bit is an information bit, mapping the to-be-mapped bit to a corresponding location based on an index of the to-be-mapped bit in the interleaving sequence, in other words, directly mapping the information bit to a corresponding location based on an index of the information bit in the interleaving sequence; or if a to-be-mapped bit is a CRC bit, determining a value of the to-be-mapped bit based on A and a CRC polynomial, and mapping the to-be-mapped bit to a corresponding location.

There are two implementable manners for determining the value of the to-be-mapped bit based on A and the CRC polynomial and mapping the to-be-mapped bit to the corresponding location. All information bits checked by using the to-be-mapped bit are determined based on A and the CRC polynomial; and addition modulo 2 is performed on all the information bits checked by using the to-be-mapped bit to obtain the value of the to-be-mapped bit, and the to-be-mapped bit is mapped to the corresponding location. In this manner, the CRC polynomial is prestored, and all the information bits checked by using the to-be-mapped bit are determined based on A in an online calculation manner.

A correspondence that is between at least one CRC bit and at least one information bit and that corresponds to A is identified from a prestored table of correspondences between CRC bits and information bits, where the correspondence between at least one CRC bit and at least one information bit indicates all information bits checked by using each of the L CRC bits, and the correspondence between at least one CRC bit and at least one information bit is obtained based on an information bit length and the CRC polynomial. In this manner, the correspondence between at least one CRC bit and at least one information bit is calculated in advance based on the information bit length and the CRC polynomial in an offline storage manner. Then, a correspondence that is between at least one CRC bit and at least one information bit and that corresponds to each information bit length is stored. In the offline storage manner, online calculation can be avoided, thereby reducing an encoding time. Subsequently, all the information bits checked by using the to-be-mapped bit are determined based on the correspondence that is between at least one CRC bit and at least one information bit and that corresponds to A, addition modulo 2 is performed on all the information bits checked by using the to-be-mapped bit to obtain the value of the to-be-mapped bit, and the to-be-mapped bit is mapped to the corresponding location.

The following describes a process of S303 in detail by using an interleaving sequence as an example. For example, when A=64, a corresponding interleaving sequence is 0, 1, 5, 6, 7, 11, 12, 13, 15, 17, 19, 22, 25, 28, 30, 32, 34, 35, 37, 39, 42, 43, 44, 46, 47, 50, 51, 53, 56, 58, 62, 63, 64, 2, 8, 14, 16, 18, 20, 23, 26, 29, 31, 33, 36, 38, 40, 45, 48, 52, 54, 57, 59, 65, 3, 9, 21, 24, 27, 41, 49, 55, 60, 66, 4, 10, 61, 67, 68, 69, 70, 71, 72, 73, 74, 75, 76, 77, 78, 79, 80, 81, 82, 83, 84, 85, 86, 87, where the boldfaced bits (64, 65, 66, 67, 68, 69, 70, 71, 72, 73, 74, 75, 76, 77, 78, 79, 80, 81, 82, 83, 84, 85, 86, and 87) are CRC bits, and remaining bits are information bits. In this embodiment, when mapping is performed based on the interleaving sequence, mapping may be sequentially performed bit by bit starting from the first bit. If a to-be-mapped bit is an information bit, for example, an information bit corresponding to the index 0, the to-be-mapped bit is directly mapped to a corresponding location based on the index 0. If a to-be-mapped bit is a CRC bit, for example, a CRC bit corresponding to the index 64, all information bits checked by using the to-be-mapped bit may be determined based on A and the CRC polynomial. Alternatively, a correspondence between at least one CRC bit corresponding to 64 and at least one information bit may be identified from the prestored table of correspondences between CRC bits and information bits; and subsequently, all information bits checked by using the to-be-mapped bit are determined based on the correspondence between at least one CRC bit and at least one information bit. Addition modulo 2 is performed on all the information bits checked by using the to-be-mapped bit to obtain the value of the to-be-mapped bit, and the to-be-mapped bit is mapped to the corresponding location.

For example: all determined information bits checked by using the CRC bit whose index is 64 are all information bits (0, 1, 5, 6, 7, 11, 12, 13, 15, 17, 19, 22, 25, 28, 30, 32, 34, 35, 37, 39, 42, 43, 44, 46, 47, 50, 51, 53, 56, 58, 62, 63) located before the CRC bit. Addition modulo 2 is performed on the information bits to obtain a value of the CRC bit whose index is 64, and the CRC bit 64 is mapped to a corresponding location All determined information bits checked by using the CRC bit whose index is 65 are some information bits located before the CRC bit 64 and all information bits located between the CRC bit 64 and the CRC bit 65 (0, 2, 5, 8, 11, 14, 15, 16, 17, 18, 19, 20, 22, 23, 25, 26, 28, 29, 30, 31, 32, 33, 34, 36, 37, 38, 39, 40, 42, 45, 46, 48, 50, 52, 53, 54, 56, 57, 58, 59, 62). Addition modulo 2 is performed on the information bits to obtain a value of the CRC bit whose index is 65, and the CRC bit 65 is mapped to a corresponding location.

All determined information bits checked by using the CRC bit whose index is 66 are some information bits located before the CRC bit 65 and all information bits located between the CRC bit 65 and the CRC bit 66 (1, 3, 6, 9, 12, 15, 16, 17, 18, 19, 20, 21, 23, 24, 26, 27, 29, 30, 31, 32, 33, 34, 35, 37, 38, 39, 40, 41, 43, 46, 47, 49, 51, 53, 54, 55, 57, 58, 59, 60, 63). Addition modulo 2 is performed on the information bits to obtain a value of the CRC bit whose index is 66, and the CRC bit 66 is mapped to a corresponding location.

All determined information bits checked by using the CRC bit whose index is 67 are some information bits located before the CRC bit 66 and all information bits located between the CRC bit 66 and the CRC bit 67 (0, 1, 2, 4, 5, 6, 10, 11, 12, 15, 16, 18, 20, 21, 24, 27, 31, 33, 36, 37, 38, 40, 41, 43, 46, 48, 51, 52, 53, 54, 55, 59, 60, 61, 62, 63). Addition modulo 2 is performed on the information bits to obtain a value of the CRC bit whose index is 67, and the CRC bit 67 is mapped to a corresponding location.

All determined information bits checked by using the CRC bit whose index is 68 are (2, 3, 15, 16, 21, 30, 35, 38, 41, 43, 46, 49, 50, 51, 52, 54, 55, 58, 60, 61). Addition modulo 2 is performed on the information bits to obtain a value of the CRC bit whose index is 68, and the CRC bit 68 is mapped to a corresponding location.

All determined information bits checked by using the CRC bit whose index is 69 are (3, 4, 16, 17, 22, 31, 36, 39, 42, 44, 47, 50, 51, 52, 53, 55, 56, 59, 61, 62). Addition modulo 2 is performed on the information bits to obtain a value of the CRC bit whose index is 69, and the CRC bit 69 is mapped to a corresponding location.

All determined information bits checked by using the CRC bit whose index is 70 are (4, 5, 17, 18, 23, 32, 37, 40, 43, 45, 48, 51, 52, 53, 54, 56, 57, 60, 62, 63). Addition modulo 2 is performed on the information bits to obtain a value of the CRC bit whose index is 70, and the CRC bit 70 is mapped to a corresponding location.

All determined information bits checked by using the CRC bit whose index is 71 are (1, 7, 11, 12, 13, 15, 17, 18, 22, 24, 25, 28, 30, 32, 33, 34, 35, 37, 38, 39, 41, 42, 43, 47, 49, 50, 51, 52, 54, 55, 56, 57, 61, 62). Addition modulo 2 is performed on the information bits to obtain a value of the CRC bit whose index is 71, and the CRC bit 71 is mapped to a corresponding location.

All determined information bits checked by using the CRC bit whose index is 72 are (0, 2, 8, 12, 13, 14, 16, 18, 19, 23, 25, 26, 29, 31, 33, 34, 35, 36, 38, 39, 40, 42, 43, 44, 48, 50, 51, 52, 53, 55, 56, 57, 58, 62, 63). Addition modulo 2 is performed on the information bits to obtain a value of the CRC bit whose index is 72, and the CRC bit 72 is mapped to a corresponding location.

All determined information bits checked by using the CRC bit whose index is 73 are (3, 5, 6, 7, 9, 11, 12, 14, 20, 22, 24, 25, 26, 27, 28, 36, 40, 41, 42, 45, 46, 47, 49, 50, 52, 54, 57, 59, 62). Addition modulo 2 is performed on the information bits to obtain a value of the CRC bit whose index is 73, and the CRC bit 73 is mapped to a corresponding location.

All determined information bits checked by using the CRC bit whose index is 74 are (4, 6, 7, 8, 10, 12, 13, 15, 21, 23, 25, 26, 27, 28, 29, 37, 41, 42, 43, 46, 47, 48, 50, 51, 53, 55, 58, 60, 63). Addition modulo 2 is performed on the information bits to obtain a value of the CRC bit whose index is 74, and the CRC bit 74 is mapped to a corresponding location.

All determined information bits checked by using the CRC bit whose index is 75 are (0, 1, 6, 8, 9, 12, 14, 15, 16, 17, 19, 24, 25, 26, 27, 29, 32, 34, 35, 37, 38, 39, 46, 48, 49, 50, 52, 53, 54, 58, 59, 61, 62, 63). Addition modulo 2 is performed on the information bits to obtain a value of the CRC bit whose index is 75, and the CRC bit 75 is mapped to a corresponding location.

All determined information bits checked by using the CRC bit whose index is 76 are (2, 5, 6, 9, 10, 11, 12, 16, 18, 19, 20, 22, 26, 27, 32, 33, 34, 36, 37, 38, 40, 42, 43, 44, 46, 49, 54, 55, 56, 58, 59, 60). Addition modulo 2 is performed on the information bits to obtain a value of the CRC bit whose index is 76, and the CRC bit 76 is mapped to a corresponding location.

All determined information bits checked by using the CRC bit whose index is 77 are (3, 6, 7, 10, 11, 12, 13, 17, 19, 20, 21, 23, 27, 28, 33, 34, 35, 37, 38, 39, 41, 43, 44, 45, 47, 50, 55, 56, 57, 59, 60, 61). Addition modulo 2 is performed on the information bits to obtain a value of the CRC bit whose index is 77, and the CRC bit 77 is mapped to a corresponding location.

All determined information bits checked by using the CRC bit whose index is 78 are (0, 4, 7, 8, 11, 12, 13, 14, 18, 20, 21, 22, 24, 28, 29, 34, 35, 36, 38, 39, 40, 42, 44, 45, 46, 48, 51, 56, 57, 58, 60, 61, 62). Addition modulo 2 is performed on the information bits to obtain a value of the CRC bit whose index is 78, and the CRC bit 78 is mapped to a corresponding location.

All determined information bits checked by using the CRC bit whose index is 79 are (0, 1, 5, 8, 9, 12, 13, 14, 15, 19, 21, 22, 23, 25, 29, 30, 35, 36, 37, 39, 40, 41, 43, 45, 46, 47, 49, 52, 57, 58, 59, 61, 62, 63). Addition modulo 2 is performed on the information bits to obtain a value of the CRC bit whose index is 79, and the CRC bit 79 is mapped to a corresponding location.

All determined information bits checked by using the CRC bit whose index is 80 are (2, 5, 7, 9, 10, 11, 12, 14, 16, 17, 19, 20, 23, 24, 25, 26, 28, 31, 32, 34, 35, 36, 38, 39, 40, 41, 43, 48, 51, 56, 59, 60). Addition modulo 2 is performed on the information bits to obtain a value of the CRC bit whose index is 80, and the CRC bit 80 is mapped to a corresponding location.

All determined information bits checked by using the CRC bit whose index is 81 are (0, 3, 6, 8, 10, 11, 12, 13, 15, 17, 18, 20, 21, 24, 25, 26, 27, 29, 32, 33, 35, 36, 37, 39, 40, 41, 42, 44, 49, 52, 57, 60, 61). Addition modulo 2 is performed on the information bits to obtain a value of the CRC bit whose index is 81, and the CRC bit 81 is mapped to a corresponding location.

All determined information bits checked by using the CRC bit whose index is 82 are (1, 4, 7, 9, 11, 12, 13, 14, 16, 18, 19, 21, 22, 25, 26, 27, 28, 30, 33, 34, 36, 37, 38, 40, 41, 42, 43, 45, 50, 53, 58, 61, 62). Addition modulo 2 is performed on the information bits to obtain a value of the CRC bit whose index is 82, and the CRC bit 82 is mapped to a corresponding location.

All determined information bits checked by using the CRC bit whose index is 83 are (2, 5, 8, 10, 12, 13, 14, 15, 17, 19, 20, 22, 23, 26, 27, 28, 29, 31, 34, 35, 37, 38, 39, 41, 42, 43, 44, 46, 51, 54, 59, 62, 63). Addition modulo 2 is performed on the information bits to obtain a value of the CRC bit whose index is 83, and the CRC bit 83 is mapped to a corresponding location.

All determined information bits checked by using the CRC bit whose index is 84 are (1, 3, 5, 7, 9, 12, 14, 16, 17, 18, 19, 20, 21, 22, 23, 24, 25, 27, 29, 34, 36, 37, 38, 40, 45, 46, 50, 51, 52, 53, 55, 56, 58, 60, 62). Addition modulo 2 is performed on the information bits to obtain a value of the CRC bit whose index is 84, and the CRC bit 84 is mapped to a corresponding location.

All determined information bits checked by using the CRC bit whose index is 85 are (0, 2, 4, 6, 8, 10, 13, 15, 17, 18, 19, 20, 21, 22, 23, 24, 25, 26, 28, 30, 35, 37, 38, 39, 41, 46, 47, 51, 52, 53, 54, 56, 57, 59, 61, 63). Addition modulo 2 is performed on the information bits to obtain a value of the CRC bit whose index is 85, and the CRC bit 85 is mapped to a corresponding location.

All determined information bits checked by using the CRC bit whose index is 86 are (0, 3, 6, 9, 12, 13, 14, 15, 16, 17, 18, 20, 21, 23, 24, 26, 27, 28, 29, 30, 31, 32, 34, 35, 36, 37, 38, 40, 43, 44, 46, 48, 50, 51, 52, 54, 55, 56, 57, 60, 63). Addition modulo 2 is performed on the information bits to obtain a value of the CRC bit whose index is 86, and the CRC bit 86 is mapped to a corresponding location.

All determined information bits checked by using the CRC bit whose index is 87 are (0, 4, 5, 6, 10, 11, 12, 14, 16, 18, 21, 24, 27, 29, 31, 33, 34, 36, 38, 41, 42, 43, 45, 46, 49, 50, 52, 55, 57, 61, 62, 63). Addition modulo 2 is performed on the information bits to obtain a value of the CRC bit whose index is 87, and the CRC bit 87 is mapped to a corresponding location.

Finally, a sequence $c_0, c_1, \ldots, c_{A+L-1}$ is obtained.

The following describes the process of S303 in detail by using another interleaving sequence as an example. For example, when A=32, a corresponding interleaving sequence is 0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55, where the boldfaced bits (32, 33, 34, 35, 36, 37, 38, 39, 40, 41, 42, 43, 44, 45, 46, 47, 48, 49, 50, 51, 52, 53, 54, and 55) are CRC bits, and remaining bits are information bits. As described above, this sequence may be prestored, or may be obtained online by using a maximum interleaving sequence. In this embodiment, when mapping is performed based on the interleaving sequence, mapping may be sequentially performed bit by bit starting from the first bit. If a to-be-mapped bit is an information bit, for example, an information bit corresponding to the index 0, the to-be-mapped bit is directly mapped to a corresponding location based on the index 0. If a to-be-mapped bit is a CRC bit, for example, a CRC bit corresponding to the index 32, all information bits checked by using the to-be-mapped bit may be determined based on A and the CRC polynomial. Alternatively, a correspondence between at least one CRC bit corresponding to 32 and at least one information bit may be identified from the prestored table of correspondences between CRC bits and information bits; and subsequently, all information bits checked by using the to-be-mapped bit are determined based on the correspondence between at least one CRC bit and at least one information bit. Addition modulo 2 is performed on all the information bits checked by using the to-be-mapped bit to obtain the value of the to-be-mapped bit, and the to-be-mapped bit is mapped to the corresponding location. For example:

All determined information bits checked by using the CRC bit whose index is 32 are all information bits (0, 2, 3, 5, 7, 10, 11, 12, 14, 15, 18, 19, 21, 24, 26, 30, 31) located before the CRC bit. Addition modulo 2 is performed on the information bits to obtain a value of the CRC bit whose index is 32, and the CRC bit 32 is mapped to a corresponding location.

All determined information bits checked by using the CRC bit whose index is 33 are (0, 1, 2, 4, 5, 6, 7, 8, 10, 13, 14, 16, 18, 20, 21, 22, 24, 25, 26, 27, 30). Addition modulo 2 is performed on the information bits to obtain a value of the CRC bit whose index is 33, and the CRC bit 33 is mapped to a corresponding location.

All determined information bits checked by using the CRC bit whose index is 34 are all information bits (0, 1, 2, 3, 5, 6, 7, 8, 9, 11, 14, 15, 17, 19, 21, 22, 23, 25, 26, 27, 28, 31) located before the CRC bit. Addition modulo 2 is performed on the information bits to obtain a value of the CRC bit whose index is 34, and the CRC bit 34 is mapped to a corresponding location.

All determined information bits checked by using the CRC bit whose index is 35 are all information bits (1, 4, 5, 6, 8, 9, 11, 14, 16, 19, 20, 21, 22, 23, 27, 28, 29, 30, 31) located before the CRC bit. Addition modulo 2 is performed on the information bits to obtain a value of the CRC bit whose index is 35, and the CRC bit 35 is mapped to a corresponding location.

All determined information bits checked by using the CRC bit whose index is 36 are all information bits (3, 6, 9, 11, 14, 17, 18, 19, 20, 22, 23, 26, 28, 29) located before the CRC bit. Addition modulo 2 is performed on the information bits to obtain a value of the CRC bit whose index is 36, and the CRC bit 36 is mapped to a corresponding location.

All determined information bits checked by using the CRC bit whose index is 37 are all information bits (4, 7, 10, 12, 15, 18, 19, 20, 21, 23, 24, 27, 29, 30) located before the CRC bit. Addition modulo 2 is performed on the information bits to obtain a value of the CRC bit whose index is 37, and the CRC bit 37 is mapped to a corresponding location.

All determined information bits checked by using the CRC bit whose index is 38 are (0, 5, 8, 11, 13, 16, 19, 20, 21, 22, 24, 25, 28, 30, 31). Addition modulo 2 is performed on the information bits to obtain a value of the CRC bit whose index is 38, and the CRC bit 38 is mapped to a corresponding location.

All determined information bits checked by using the CRC bit whose index is 39 are (0, 1, 2, 3, 5, 6, 7, 9, 10, 11, 15, 17, 18, 19, 20, 22, 23, 24, 25, 29, 30). Addition modulo 2 is performed on the information bits to obtain a value of the CRC bit whose index is 39, and the CRC bit 39 is mapped to a corresponding location.

All determined information bits checked by using the CRC bit whose index is 40 are (1, 2, 3, 4, 6, 7, 8, 10, 11, 12, 16, 18, 19, 20, 21, 23, 24, 25, 26, 30, 31). Addition modulo 2 is performed on the information bits to obtain a value of the CRC bit whose index is 40, and the CRC bit 40 is mapped to a corresponding location.

All determined information bits checked by using the CRC bit whose index is 41 are (4, 8, 9, 10, 13, 14, 15, 17, 18, 20, 22, 25, 27, 30). Addition modulo 2 is performed on the information bits to obtain a value of the CRC bit whose index is 41, and the CRC bit 41 is mapped to a corresponding location.

All determined information bits checked by using the CRC bit whose index is 42 are (5, 9, 10, 11, 14, 15, 16, 18, 19, 21, 23, 26, 28, 31). Addition modulo 2 is performed on the information bits to obtain a value of the CRC bit whose index is 42, and the CRC bit 42 is mapped to a corresponding location.

All determined information bits checked by using the CRC bit whose index is 43 are (0, 2, 3, 5, 6, 7, 14, 16, 17, 18, 20, 21, 22, 26, 27, 29, 30, 31). Addition modulo 2 is performed on the information bits to obtain a value of the CRC bit whose index is 43, and the CRC bit 43 is mapped to a corresponding location.

All determined information bits checked by using the CRC bit whose index is 44 are (0, 1, 2, 4, 5, 6, 8, 10, 11, 12, 14, 17, 22, 23, 24, 26, 27, 28). Addition modulo 2 is performed on the information bits to obtain a value of the CRC bit whose index is 44, and the CRC bit 44 is mapped to a corresponding location.

All determined information bits checked by using the CRC bit whose index is 45 are (1, 2, 3, 5, 6, 7, 9, 11, 12, 13, 15, 18, 23, 24, 25, 27, 28, 29). Addition modulo 2 is performed on the information bits to obtain a value of the CRC bit whose index is 45, and the CRC bit 45 is mapped to a corresponding location.

All determined information bits checked by using the CRC bit whose index is 46 are (2, 3, 4, 6, 7, 8, 10, 12, 13, 14, 16, 19, 24, 25, 26, 28, 29, 30). Addition modulo 2 is performed on the information bits to obtain a value of the CRC bit whose index is 46, and the CRC bit 46 is mapped to a corresponding location.

All determined information bits checked by using the CRC bit whose index is 47 are (3, 4, 5, 7, 8, 9, 11, 13, 14, 15, 17, 20, 25, 26, 27, 29, 30, 31). Addition modulo 2 is performed on the information bits to obtain a value of the CRC bit whose index is 47, and the CRC bit 47 is mapped to a corresponding location.

All determined information bits checked by using the CRC bit whose index is 48 are (0, 2, 3, 4, 6, 7, 8, 9, 11, 16, 19, 24, 27, 28). Addition modulo 2 is performed on the information bits to obtain a value of the CRC bit whose index is 48, and the CRC bit 48 is mapped to a corresponding location.

All determined information bits checked by using the CRC bit whose index is 49 are (0, 1, 3, 4, 5, 7, 8, 9, 10, 12, 17, 20, 25, 28, 29). Addition modulo 2 is performed on the information bits to obtain a value of the CRC bit whose index is 49, and the CRC bit 49 is mapped to a corresponding location.

All determined information bits checked by using the CRC bit whose index is 50 are (1, 2, 4, 5, 6, 8, 9, 10, 11, 13, 18, 21, 26, 29, 30). Addition modulo 2 is performed on the information bits to obtain a value of the CRC bit whose index is 50, and the CRC bit 50 is mapped to a corresponding location.

All determined information bits checked by using the CRC bit whose index is 51 are (2, 3, 5, 6, 7, 9, 10, 11, 12, 14, 19, 22, 27, 30, 31). Addition modulo 2 is performed on the information bits to obtain a value of the CRC bit whose index is 51, and the CRC bit 51 is mapped to a corresponding location.

All determined information bits checked by using the CRC bit whose index is 52 are (2, 4, 5, 6, 8, 13, 14, 18, 19, 20, 21, 23, 24, 26, 28, 30). Addition modulo 2 is performed on the information bits to obtain a value of the CRC bit whose index is 52, and the CRC bit 52 is mapped to a corresponding location.

All determined information bits checked by using the CRC bit whose index is 53 are (3, 5, 6, 7, 9, 14, 15, 19, 20, 21, 22, 24, 25, 27, 29, 31). Addition modulo 2 is performed on the information bits to obtain a value of the CRC bit whose index is 53, and the CRC bit 53 is mapped to a corresponding location.

All determined information bits checked by using the CRC bit whose index is 54 are (0, 2, 3, 4, 5, 6, 8, 11, 12, 14, 16, 18, 19, 20, 22, 23, 24, 25, 28, 31). Addition modulo 2 is performed on the information bits to obtain a value of the CRC bit whose index is 54, and the CRC bit 54 is mapped to a corresponding location.

All determined information bits checked by using the CRC bit whose index is 55 are (1, 2, 4, 6, 9, 10, 11, 13, 14, 17, 18, 20, 23, 25, 29, 30, 31). Addition modulo 2 is performed on the information bits to obtain a value of the CRC bit whose index is 55, and the CRC bit 55 is mapped to a corresponding location.

Finally, a sequence $c_0, c_1, \ldots, c_{A+L-1}$ is obtained.

S304. Encode the first bit sequence.

Similarly, the encoding herein may be polar encoding, LDPC encoding, or other channel encoding.

According to the channel encoding method provided in this embodiment, after the A to-be-encoded information bits are obtained, the interleaving sequence is obtained based on the quantity A of the information bits. Then, CRC encoding and an interleaving operation are simultaneously performed to obtain the first bit sequence. Finally, the first bit sequence is encoded. In this way, a distributed CRC encoding process can be quickly completed to perform channel encoding as soon as possible, so as to reduce an encoding delay. Moreover, decoding has an early stop capability, so that decoding can end in advance, thereby reducing a decoding delay.

It should be noted that a receive end (a decoder side) needs to perform a de-interleaving operation after receiving to-be-decoded information bits. A process in which the receive end obtains an interleaving sequence during de-interleaving is consistent with a process in which a transmit end (an encoder side) obtains an interleaving sequence during interleaving. For details, refer to the descriptions of the encoder. The details are not described herein again.

Figure 6:
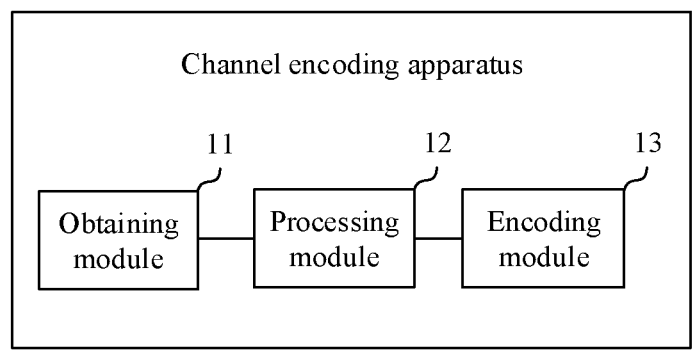
FIG. 6 is a schematic structural diagram of an embodiment of a channel encoding apparatus.

FIG. 6 is a schematic structural diagram of an embodiment of a channel encoding apparatus. As shown in FIG. 6, the apparatus in this embodiment may include an obtaining module 11, a processing module 12, and an encoding module 13. The obtaining module 11 is configured to obtain A to-be-encoded information bits.

The processing module 12 is configured to map the A to-be-encoded information bits and L CRC bits to a first bit sequence based on an interleaving sequence, where the L CRC bits are obtained based on the A to-be-encoded information bits and a CRC polynomial, the interleaving sequence is obtained from a prestored interleaving sequence table or is obtained based on a maximum-length interleaving sequence, A+L is less than or equal to Kmax, and Kmax is a length of the maximum-length interleaving sequence.

The encoding module 13 is configured to encode the first bit sequence.

The apparatus in this embodiment may be configured to perform the solution in the method embodiment shown in FIG. 3. Implementation principles thereof are similar, and details are not described herein again.

According to the channel encoding apparatus provided in this embodiment, after the A to-be-encoded information bits are obtained, the A to-be-encoded information bits and the L CRC bits are mapped to the first bit sequence based on the interleaving sequence. The L CRC bits are obtained based on the A to-be-encoded information bits and the CRC polynomial, and the interleaving sequence is obtained from the prestored interleaving sequence table or is obtained based on the maximum-length interleaving sequence. Finally, the first bit sequence is encoded. In this way, not only an encoding delay can be reduced, but also decoding has an early stop capability, so that decoding can end in advance, thereby reducing a decoding delay.

Figure 7:
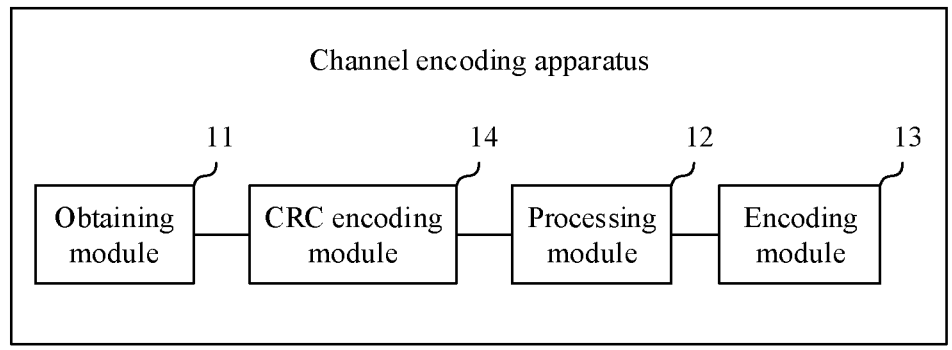
FIG. 7 is a schematic structural diagram of an embodiment of a channel encoding apparatus.

FIG. 7 is a schematic structural diagram of an embodiment of a channel encoding apparatus. As shown in FIG. 7, on the basis of the structure of the apparatus shown in FIG. 6, the apparatus in this embodiment may further include a CRC encoding module 14. The CRC encoding module 14 is configured to: before a processing module 12 maps A to-be-encoded information bits and L CRC bits to a first bit sequence based on an interleaving sequence, perform CRC encoding on the A to-be-encoded information bits based on a CRC polynomial to obtain the L CRC bits.

Optionally, the processing module 12 is configured to: map the A to-be-encoded information bits and the L CRC bits to the first bit sequence based on the interleaving sequence and according to the following rule:

if a to-be-mapped bit is an information bit, mapping the to-be-mapped bit to a corresponding location based on an index of the to-be-mapped bit in the interleaving sequence; or if a to-be-mapped bit is a CRC bit, determining a value of the to-be-mapped bit based on A and the CRC polynomial, and mapping the to-be-mapped bit to a corresponding location.

Further, in a feasible implementation, the processing module 12 is configured to:

determine, based on A and the CRC polynomial, all information bits checked by using the to-be-mapped bit; and perform addition modulo 2 on all the information bits checked by using the to-be-mapped bit to obtain the value of the to-be-mapped bit and map the to-be-mapped bit to the corresponding location.

In another feasible implementation, the processing module 12 is configured to: identify a correspondence that is between at least one CRC bit and at least one information bit and that corresponds to A from a prestored table of correspondences between CRC bits and information bits, where the correspondence between at least one CRC bit and at least one information bit indicates all information bits checked by using each of the L CRC bits, and the correspondence between at least one CRC bit and at least one information bit is obtained based on an information bit length and the CRC polynomial;

determine, based on the correspondence that is between at least one CRC bit and at least one information bit and that corresponds to A, all information bits checked by using the to-be-mapped bit; and perform addition modulo 2 on all the information bits checked by using the to-be-mapped bit to obtain the value of the to-be-mapped bit and map the to-be-mapped bit to the corresponding location.

In the foregoing embodiment, in the interleaving sequence table, each information bit length corresponds to one interleaving sequence.

The apparatus in this embodiment may be configured to perform the solution in the method embodiment shown in FIG. 3. Implementation principles thereof are similar, and details are not described herein again.

In the embodiments, a transmit end may be divided into functional modules based on the foregoing method examples. For example, each functional module may be obtained through division for a corresponding function, or two or more functions may be integrated into one processing module. The integrated module may be implemented in a form of hardware or may be implemented in a form of a software functional module. It should be noted that, in this embodiment, module division is an example, and is merely logical function division. During actual implementation, another division manner may be used.

Figure 8:
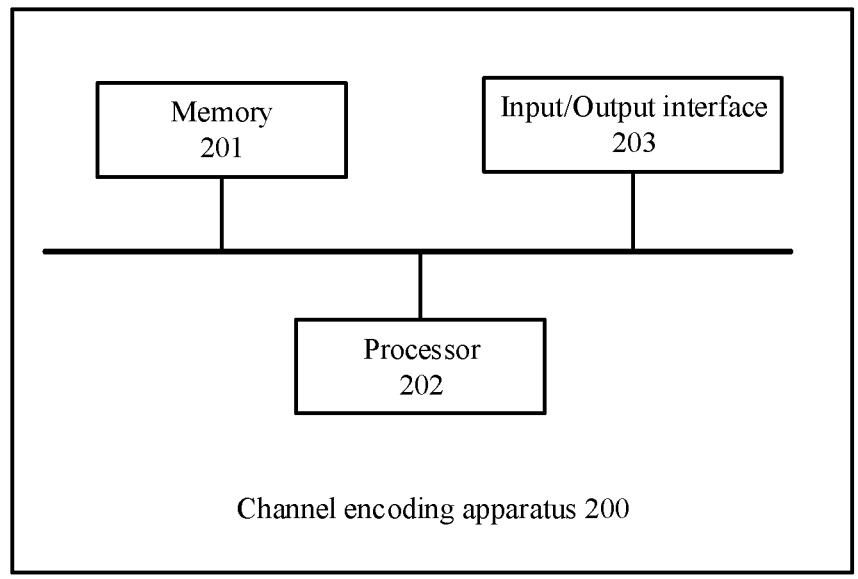
FIG. 8 is a schematic structural diagram of a channel encoding apparatus.

FIG. 8 is a schematic structural diagram of a channel encoding apparatus 200 according to the embodiments. The channel encoding apparatus 200 includes:

a memory 201, configured to store a program instruction, where the memory 201 may be a flash (flash memory); and a processor 202, configured to invoke and execute the program instruction in the memory, to implement steps in the channel encoding method in FIG. 3, FIG. 4, or FIG. 5, where for details, refer to the related descriptions in the foregoing method embodiments.

The channel encoding apparatus 200 may further include an input/output interface 203. The input/output interface 203 may include an independent output interface and an independent input interface or may be an integrated interface integrating input and output. The output interface is configured to output data, and the input interface is configured to obtain input data. The output data is a general term of output in the foregoing method embodiments, and the input data is a general term of input in the foregoing method embodiments.

The channel encoding apparatus 200 may be configured to perform the steps and/or procedures that correspond to the transmit end in the foregoing method embodiments.

The embodiments further provide a non-transitory computer-readable storage medium. The non-transitory computer-readable storage medium includes a computer program. The computer program is used to implement the channel encoding method in the foregoing method embodiments.

The embodiments further provide a program product, such as a computer program product. The program product includes a computer program, and the computer program is stored in a non-transitory computer-readable storage medium. At least one processor of a channel encoding apparatus may read the computer program from the non-transitory computer-readable storage medium, and the at least one processor executes the computer program, so that the channel encoding apparatus implements the channel encoding method in the foregoing method embodiments.

The embodiments further provide a chip. The chip is connected to a memory, or a memory is integrated on the chip. When a software program stored in the memory is executed, the channel encoding method in the foregoing method embodiments is implemented.

A person of ordinary skill in the art may understand that all or some of the foregoing embodiments may be implemented by using software, hardware, firmware, or any combination thereof. When software is used to for implementation, all or some of the embodiments may be implemented in a form of a computer program product. The computer program product includes one or more computer instructions. When the computer program instructions are loaded and executed on a computer, all or some of the procedures or functions according to the embodiments are generated. The computer may be a general-purpose computer, a special-purpose computer, a computer network, or another programmable apparatus. The computer instructions may be stored in a non-transitory computer-readable storage medium or may be transmitted from one non-transitory computer-readable storage medium to another non-transitory computer-readable storage medium. For example, the computer instructions may be transmitted from one website, computer, server, or data center to another website, computer, server, or data center in a wired (for example, a coaxial cable, an optical fiber, or a digital subscriber line (DSL)) or wireless (for example, infrared, radio, or microwave) manner. The non-transitory computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

What is claimed is:

1. A channel decoding method comprising:
obtaining to-be-decoded bits, wherein the to-be-decoded bits comprise A information bits and L cyclic redundancy check (CRC) bits; and
performing channel decoding on the to-be-decoded bits, wherein the channel decoding comprises de-interleaving with an interleaving sequence and a CRC check operation with a CRC polynomial, the interleaving sequence is obtained from a prestored interleaving sequence table based on a value of A and not based on CRC data, and, in the interleaving sequence table, each information bit length corresponds uniquely to one and only one interleaving sequence.

2. The channel decoding method according to claim 1, wherein the deinterleaving further comprises:
determining positions of the A information bits and the L CRC bits.

3. The channel decoding method according to claim 2, wherein determining the positions of the A information bits and the L CRC bits further comprises:
identifying a correspondence that is between at least one CRC bit and at least one information bit and that corresponds to A from a prestored table of correspondences between the L CRC bits and the A information bits, wherein the correspondence between at least one CRC bit and at least one information bit indicates all information bits checked by using each of the L CRC bits, the correspondence between the at least one CRC bit and the at least one information bit is obtained based on an information bit length and the CRC polynomial, and the CRC check operation is based on the correspondence.

4. The channel decoding method according to claim 1, wherein, when A=32, the interleaving sequence in the prestored interleaving sequence table is:
0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55, wherein 32, 33, 34, 35, 36, 37, 38, 39, 40, 41, 42, 43, 44, 45, 46, 47, 48, 49, 50, 51, 52, 53, 54, and 55 are indexes of CRC bits.

5. A channel decoding apparatus, comprising:
a memory configured to store a program instruction; and
a processor configured to execute the program instruction to:
obtain to-be-decoded bits, wherein the to-be-decoded bits comprise A information bits and L cyclic redundancy check (CRC) bits; and
perform channel decoding on the to-be-decoded bits, wherein the channel decoding comprises de-interleaving with an interleaving sequence and a CRC check operation with a CRC polynomial, the interleaving sequence is obtained from a prestored interleaving sequence table based on a value of A and not based on CRC data, and, in the interleaving sequence table, each information bit length corresponds uniquely to one and only one interleaving sequence.

6. The channel decoding apparatus according to claim 5, wherein the deinterleaving further comprises:
determining positions of the A information bits and the L CRC bits.

7. The channel decoding apparatus according to claim 6, wherein determining the positions of the A information bits and the L CRC bits further comprises:
identifying a correspondence that is between at least one CRC bit and at least one information bit and that corresponds to A from a prestored table of correspondences between the L CRC bits and the A information bits, wherein the correspondence between the at least one CRC bit and the at least one information bit indicates all information bits checked by using each of the L CRC bits, the correspondence between the at least one CRC bit and the at least one information bit is obtained based on an information bit length and the CRC polynomial, and the CRC check operation is based on the correspondence.

8. The channel decoding apparatus according to claim 5, wherein, when A=32, the interleaving sequence in the prestored interleaving sequence table is:
0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55, wherein 32, 33, 34, 35, 36, 37, 38, 39, 40, 41, 42, 43, 44, 45, 46, 47, 48, 49, 50, 51, 52, 53, 54, and 55 are indexes of CRC bits.

9. The channel decoding apparatus according to claim 5, wherein the apparatus is a chip, a terminal device, or a network device.

10. A non-transitory computer-readable storage medium embodying computer program code that, when executed by a channel decoding apparatus, is configured to configure the channel decoding apparatus to:
obtain to-be-decoded bits, wherein the to-be-decoded bits comprise A information bits and L cyclic redundancy check (CRC) bits; and
perform channel decoding on the to-be-decoded bits, wherein the channel decoding comprises de-interleaving with an interleaving sequence and a CRC check operation with a CRC polynomial, the interleaving sequence is obtained from a prestored interleaving sequence table based on a value of A and not based on CRC data, and, in the interleaving sequence table, each information bit length corresponds uniquely to one and only one interleaving sequence.

11. The non-transitory computer-readable storage medium according to claim 10, wherein the deinterleaving further comprises:
determining positions of the A information bits and the L CRC bits.

12. The non-transitory computer-readable storage medium according to claim 11, wherein determining the positions of the A information bits and the L CRC bits further comprises:
identifying a correspondence that is between at least one CRC bit and at least one information bit and that corresponds to A from a prestored table of correspondences between the L CRC bits and the A information bits, wherein the correspondence between the at least one CRC bit and the at least one information bit indicates all information bits checked by using each of the L CRC bits, and the correspondence between the at least one CRC bit and the at least one information bit is obtained based on an information bit length and the CRC polynomial, and the CRC check operation is based on the correspondence.

13. The non-transitory computer-readable storage medium according to claim 10, wherein, when A=32, the interleaving sequence in the prestored interleaving sequence table is:
0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55, wherein 32, 33, 34, 35, 36, 37, 38, 39, 40, 41, 42, 43, 44, 45, 46, 47, 48, 49, 50, 51, 52, 53, 54, and 55 are indexes of CRC bits.

\* \* \* \* \*